(12) United States Patent
Liu (10) Patent No.: US 6,656,820 B2
(45) Date of Patent: Dec. 2, 2003

(54) METHOD FOR MANUFACTURING A SEMICONDUCTOR DEVICE HAVING A RELIABLE THINNING STEP

(75) Inventor: Yi Liu, Amagasaki (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/986,372

(22) Filed: Nov. 8, 2001

(65) Prior Publication Data

US 2002/0123210 A1 Sep. 5, 2002

(30) Foreign Application Priority Data

Nov. 8, 2000 (JP) ........................ 2000-340262

(51) Int. Cl.⁷ .................. H01L 21/301; H01L 21/46; H01L 21/78
(52) U.S. Cl. .................. 438/460; 438/458; 438/459; 438/464; 438/465
(58) Field of Search .................. 438/458, 459, 438/460, 464, 465

(56) References Cited

U.S. PATENT DOCUMENTS

| | | | |
|---|---|---|---|
| 4,626,275 A | * | 12/1986 | Rempfler ................ 504/225 |
| 5,270,261 A | * | 12/1993 | Bertin et al. ........ 148/DIG. 135 |
| 5,455,202 A | * | 10/1995 | Malloy et al. ....... 148/DIG. 12 |
| 5,641,714 A | * | 6/1997 | Yamanaka ........... 148/DIG. 28 |
| 5,888,883 A | * | 3/1999 | Sasaki et al. ............... 438/460 |
| 5,919,713 A | * | 7/1999 | Ishii et al. .................. 438/460 |
| 6,110,806 A | * | 8/2000 | Pogge ....................... 257/797 |
| 6,136,668 A | * | 10/2000 | Tamaki et al. ............. 438/462 |
| 6,391,744 B1 | * | 5/2002 | Hudak et al. .............. 438/149 |

FOREIGN PATENT DOCUMENTS

| | | |
|---|---|---|
| JP | 6-216092 A | 8/1994 |
| JP | 9-213662 A | 8/1997 |

* cited by examiner

Primary Examiner—John F. Niebling
Assistant Examiner—Angel Roman
(74) Attorney, Agent, or Firm—Birch, Stewart, Kolasch & Birch, LLP (57) ABSTRACT

The present invention relates to a method for manufacturing a semiconductor device from a step of thinning a semiconductor device substrate to a step of dicing it, and a semiconductor device. The method for manufacturing a semiconductor device substrate of the present invention is characterized by carrying out a series of processes from a step of uniformly thinning a whole surface of a semiconductor device substrate to a step of back-metal plating, while the semiconductor device substrate is unified with a dummy substrate. Therefore, the present invention allows a semiconductor device to be manufactured without breaking the thinned semiconductor device substrate even after the thinned substrate is separated from the dummy substrate.

11 Claims, 5 Drawing Sheets

METHOD FOR MANUFACTURING A SEMICONDUCTOR DEVICE HAVING A RELIABLE THINNING STEP

FIELD OF THE INVENTION

The present invention relates to a method for manufacturing a semiconductor device from a step of thinning a semiconductor device substrate to a step of dicing it, and a semiconductor device.

BACKGROUND OF THE INVENTION

Recently, in the field of a semiconductor integrated circuit, developments in making a device more dense and more integrated are progressing and, as a mobile communicating device is getting smaller and lighter, the device is getting finer.

Generally, as an area of a device is getting smaller, the thermal resistance of the device is getting larger. In order to realize a device with a high performance and a high reliability, it is essential to reduce the thermal resistance of the device. Therefore, a variety of approaches have been taken to improve the effect of heat radiation.

The most effective way to reduce the thermal resistance of a device is to thin a whole substrate after an integrated circuit device pattern is formed on the substrate. However, since a GaAs substrate generally used is bristle and is breakable, when a GaAs substrate having a diameter of 3 inches or more is thinned to, for example, 50 $\mu$m or less, a problem occurs that the thinned substrate is broken in subsequent steps of handling, transporting, mounting, and the like.

Generally, in order to prevent a semiconductor substrate from breaking when it is thinned, the substrate is fixed to a supporting plate. A photosensitive adhesive tape having an UV-sensitive adhesive layer is used to fix the semiconductor substrate. Since the UV-sensitive adhesive layer of the UV-sensitive adhesive tape is deteriorated in the adhesion strength by UV irradiation, it becomes easier to remove the thinned substrate from the supporting plate. Further, since no residue remains on the device side of the semiconductor substrate after removing, an UV-sensitive adhesive tape is extensively used.

For example, JP-A 216092/1994 describes a method for fixing a GaAs substrate on a supporting plate by using a tape with a composite structure consisting of a UV-sensitive adhesive layer and a heat foamable adhesive layer. In this method, a semiconductor substrate is fixed on a supporting plate by bonding the UV-sensitive adhesive layer to a surface of the semiconductor substrate on which a device is formed, and by bonding the heat foam able adhesive layer to the supporting plate. After thinning, the adhesion strength of the UV-sensitive adhesion layer is reduced by UV irradiation to remove the thinned semiconductor substrate.

Therefore, in this method, since a thinned substrate is handled in steps of dicing, mounting and the like, a problem remains that the thinned substrate is easy to be broken in handling in these steps.

In addition, JP-A 213662/1997 describes, as a method of preventing a substrate from breaking in the step of thinning the substrate, a method which comprises, first, forming a dicing groove having a predetermined depth on a wafer on which semiconductor devices are formed, fixing the wafer by adhering an adhesion sheet to the surface of the wafer on which semiconductor devices are formed and, then, grinding the back side of the wafer until reaching the groove to split into individual chips.

This method is effective for preventing the breakdown of thinned substrates because devices are split along dicing lines in a step of thinning. However, since the devices are perfectly split after thinning, all the devices can not be electrically connected in a step of back-metal plating to reinforce the substrate and, consequently, it is impossible to plate the whole surface of the wafer simultaneously. Thus, this method exhibits a very poor productivity.

Accordingly, an object of the present invention is to provide a method for manufacturing a device, which comprises a series of processes from a step of thinning a semiconductor device substrate having a large diameter, a step of reinforcing the thinned substrate, and a step of mounting the thinned device. More specifically, an object of the present invention is to provide a high-productive method of manufacturing a semiconductor device without damaging and polluting the semiconductor device substrate having a large diameter.

The method for manufacturing a semiconductor device substrate of the present invention is characterized by carrying out a series of processes from a step of uniformly thinning a whole surface of a semiconductor device substrate to a step of back-metal plating, while the semiconductor device substrate is unified with a dummy substrate. Therefore, the present invention allows a semiconductor device to be manufactured without breaking the thinned semiconductor device substrate even after the thinned substrate is separated from the dummy substrate.

First, the whole process of the present method for manufacturing a semiconductor device will be explained hereinafter.

A semiconductor device is bonded to a dummy substrate by using an adhesive sheet and the like to unify them. After the unified substrates are fixed on a pedestal support with wax and the like, the semiconductor device substrate is thinned by mirror-polishing. The unified substrates are fixed by vacuuming, and the semiconductor device substrate is thinned by grinding or by etching the backside of the semiconductor device substrate. After thinning, a step of back-metal plating is carried out in the unified state of the thinned semiconductor device substrate/the dummy substrate. Subsequently, the thinned substrate that has been plated is separated from the dummy substrate. After separation, the thinned substrate that has been plated is diced.

Particularly, in the case of polishing or grinding, an intrasubstrate fluctuation in the thickness of the dummy substrate to which the semiconductor device substrate is bonded with the adhesive sheet, is finally reflected in an intrasubstrate fluctuation in the thickness of the thinned GaAs semiconductor device substrate. Therefore, it is especially required that the intrasubstrate fluctuation in the thickness of the dummy substrate is small.

For example, when it is desired that a semiconductor substrate is thinned to 30 $\mu$m, if the fluctuation within a surface in the thickness of the dummy substrate is 10 $\mu$m, the thickness of the thinned semiconductor substrate becomes 20~40 $\mu$m (30±10 $\mu$m), resulting in that the thickness of the substrate within the surface varies twice at maximum. Considering that the thermal resistance of a semiconductor substrate is approximately proportional to the thickness of the substrate, the thermal resistance of the substrate within the surface varies twice. That is, the fluctuation in the thickness of the dummy substrate results in the fluctuation in the thermal resistance of the device obtained after thinning and, in turn, it affects the reliability of the device.

Therefore, in the case of thinning a semiconductor device substrate to a thickness of 40 μm or less, it is desirable that the intrasubstrate fluctuation in the thickness of the dummy substrate is within ±5 μm.

Generally, when a substrate is thinned, in order to improve workability of thinning, an abrasive having a large particle size (e.g., particle size 9 μm) is used to grind the substrate to achieve a predetermined thickness in a short period. The maximum difference in the thickness within the uneven surface that has been thinned is 2 μm or more.

SUMMARY OF THE INVENTION

As will be explained later, the present inventors have found that when an Au plate layer was formed on a GaAs substrate, the maximum difference in the thickness within the uneven surface greatly affected an adherability between the GaAs substrate and the Au plate layer.

Generally, a back metal layer is formed on a substrate by dip-etching the substrate to clean its surface, depositing a power feed layer for plating on the surface and, thereafter, plating a metal. However, dip etching alone can not make the maximum difference in the thickness within the uneven surface below 0.5 μm, and the adherability of the plate layer is insufficient. In order to improve the adhering strength between the GaAs substrate and the Au plate layer, it is essential that the surface of the substrate that has been thinned is mirror-polished and, further, a surface oxide layer is thoroughly removed by etching.

Thus, in the present invention, in order to improve the adherability, after thinning the GaAs substrate, the surface is mirror-polished by using an alumina abrasion having a particle size of 0.05 μm or less and, then, the surface oxide layer is thoroughly removed with a phosphoric acid etchant so that the maximum difference in the thickness within the mirror-polished surface is suppressed below 0.2 μm.

Additionally, from a viewpoint of the fluctuation in the thickness within the etched surface and controllability of the thickness, an appropriate range of etching depth is 0.5~30 μm.

According to the procedure of the present invention, since steps of thinning and plating are carried out while a semiconductor device substrate is unified with a dummy substrate, the breakdown of the substrate does not occur. In addition, after separating the thinned substrate from the dummy substrate, since the thinned substrate is reinforced with the back metal, the thinned substrate can be handled without breaking in the step of separating and the final step of dicing the thinned substrate.

Further, the present invention provides a method for manufacturing a semiconductor device, which comprises, a step of thinning a semiconductor device substrate, fixing the semiconductor substrate to a dummy substrate with a heat foamable adhesive sheet, and fixing the dummy substrate to a pedestal support to thin the semiconductor substrate.

By using the heat foamable adhesive sheet as a sheet for fixing the semiconductor device substrate to the dummy substrate, the semiconductor device substrate is easily peeled off from the dummy substrate after thinning, and it can endure heat-up in the steps of depositing the power feeding metal and back-metal plating.

In addition, the present invention provides a method for manufacturing a semiconductor device, wherein the semiconductor device substrate is fixed to the dummy substrate by bonding a heat foamable-adhesive side of the heat foamable adhesive sheet to a device side of the semiconductor device substrate, and by bonding a normal adhesive side of the heat foamable adhesive sheet to the dummy substrate.

Since the adhesion strength of the heat foamable adhesive becomes almost zero by heating, the semiconductor device substrate is easily peeled off from the dummy substrate. In addition, since a heat foamable adhesive sheet is used in place of a conventional UV-sensitive adhesive sheet, a conventional exposure process is made redundant, and it is unnecessary for the dummy substrate to be transparent. Consequently, there is an advantage that the limit in selecting a substrate is abolished.

Further, the method for manufacturing a semiconductor device according to the present invention is characterized by that a temperature for heat-foaming the heat foamable adhesive sheet is higher than a temperature of the substrate during the step of back-metal plating.

In a step of back-metal plating, when a temperature of the substrate is elevated above the temperature for heat-foaming the heat foamable adhesive sheet in depositing a power feeding metal layer and plating a metal, the thinned semiconductor device substrate is separated from the dummy substrate and breaks. Even when heat-up occurs locally, the heat foamable adhesive sheet foams locally and, therefore, the thinned substrate breaks locally. This problem can be solved by using a heat foamable adhesive sheet having a higher foaming temperature than the temperature of the substrate in the step of back-metal plating.

Sill further, the present invention provides a method for manufacturing a semiconductor device, wherein the maximum difference in the thickness of the uneven surface of the substrate which has been thinned is 0.2 μm or less, and wherein the thinned surface is treated by etching.

Generally, after grinding a substrate, the maximum difference in thickness within the ground surface is more than 1~2 μm. Although the surface is cleaned by dip etching prior to plating, it is impossible to make the maximum difference in the thickness within the uneven surface below 0.5 μm only by a dip etching. The maximum difference in the thickness within the uneven surface greatly affects the adherability between a GaAs substrate and an Au plate layer.

In the method of the present invention, in order to improve the adherability between the GaAs substrate and the Au plate layer, after thinning the substrate, the surface is mirror-polished and, then, the surface oxide layer is thoroughly removed so that the maximum difference in the thickness within the mirror-polished surface is suppressed below 0.2 μm, and, subsequently, a power feeding layer is deposited prior to metal plating.

The present invention provides a method for manufacturing a semiconductor device, wherein the step of back-metal plating the semiconductor device substrate comprises adhering a metal for power feeding and, then, plating a metal thereon while the semiconductor device substrate is fixed to the dummy substrate with a heat foamable adhesive sheet.

According to the present invention, the whole surface of the thinned semiconductor device substrate can be plated with a back metal in a state where the semiconductor device substrate is fixed to the dummy substrate with a heat foamable adhesive sheet. A heat foamable adhesive sheet has a disadvantage that a part of the foamed adhesive remains on the substrate surface after removal of the substrate. However, since the thinned substrate is reinforced by a back metal with its whole surface plated, after the thinned substrate is peeled off from the dummy substrate, the remaining adhesive is thoroughly removed off by washing and ashing the substrate surface without breaking.

In addition, the present invention provides a method for manufacturing a semiconductor device, wherein the step of dicing the semiconductor device substrate comprises bonding a plated surface of the semiconductor device substrate to a surface to be foamed of the heat foamable adhesive sheet, bonding a dicing sheet to the opposite surface of the heat foamable adhesive sheet and, then, dicing them halfway in the dicing sheet.

When the thinned semiconductor device substrate is directly attached to a dicing sheet, devices break upon peeling the devices off from the dicing sheet due to the strong adhesion of the dicing sheet. In particular, when the thinned semiconductor device substrate is not so thick and the reinforcement with the back metal layer is not so strong, for example, in the case where the thickness of a device substrate 5 is 50 μm or less, and the thickness of the Au plate layers 7, 8 is 5 μm or less, when the device substrate 5 is directly attached to a dicing sheet 10, upon peeling devices off from the dicing sheet 10 in a step of mounting after dicing, the device substrate 5 is broken due to the strong adhesion of the dicing sheet 10.

Accordingly, in the present invention, since a heat foamable adhesive sheet capable of being easily peeled off by heating is attached to the device substrate and, then, a dicing sheet is attached to the heat foamable adhesive sheet, the devices are peeled off from the dicing sheet after dicing while the device is unified with the heat foamable adhesive, and, therefore, the device is not broken so much so that it is readily to handle the device.

Further, the present invention provides a method for manufacturing a semiconductor device, wherein the diced, thinned semiconductor device substrate/heat formable adhesive sheet is peeled off from the dicing sheet substrate and, then, the semiconductor device substrate is separate from the heat foamable adhesive sheet by heating.

When the thickness of the thinned substrate is 100 μm or more, it is unnecessary to form a back metal because the thinned substrate does not break. In this case, the thinned device and the heat foamable adhesive sheet may be separated each other by heating the whole of the thinned, unified device/heat foamable adhesive sheet after dicing. Alternatively, only needed devices may be taken out and separated from the heat foamable adhesive sheet by heating.

A compound semiconductor GaAs substrate generally used as a semiconductor substrate is brittle and, particularly for a large substrate having a diameter of 2 inches or more, it is essential to prevent the substrate from breaking by handling.

According to the present invention, the semiconductor substrate is bonded to the dummy substrate to form a unified structure and, the semiconductor substrate can be handled from a step of thinning to a step of back-metal plating without breaking the semiconductor substrate. Since even a compound semiconductor substrate more unbreakable than a GaAs substrate, such as InP, GaN, SiC and the like, becomes breakable when the thickness becomes thin, the method of the present invention exhibits an effect to improve the handling property in a step of manufacturing a semiconductor device using a compound semiconductor substrate. That is, the method of the present invention is useful for manufacturing a semiconductor device in which the semiconductor device substrate is a compound semiconductor substrate.

Since a dummy substrate is required to be a substrate which is thin and unbreakable, and which has a uniform thickness, the present invention uses a substrate such as a silicone wafer, a glass plate, a ceramic plate, a metal plate and the like. A silicone wafer is particularly preferred because it is difficult to break and is excellent in uniformity of a thickness.

In addition, the GaAs semiconductor substrate manufactured by the method of the present invention is characterized by that the device substrate and the metal plate layer are diced vertically to the device surface of the substrate.

According to the present invention, since, in the step of thinning, the adherability between the GaAs semiconductor substrate and the back metal is improved by reducing the unevenness of the thinned substrate surface, and by mirror-polishing the thinned surface by etching, the GaAs semiconductor substrate and the back metal layer never be separated even when the both members are simultaneously diced vertically to the device surface.

Simultaneous and vertical dicing results in improvement of the productivity, and also has an effect that chip mounting can be done without damaging the chip because it is easy to hold an edge surface of the chip with a collet. Especially when a chip having a thickness of 20~50 μm is handled, it is important that an edge surface is vertical.

In addition, according to the present invention, it is possible to reduce a thickness of the GaAs semiconductor device substrate to minimal about 20 μm by the controllability of mirror-polishing and chemical etching, and to minimal about 100 μm by the controllability of grinding.

Although a thermal resistance of a GaAs semiconductor device substrate is getting lower as the substrate is getting thinner, it is desirable that the thickness of the device substrate is 20 μm or more in view of the flatness of a wiring on the surface of a GaAs semiconductor device and mounting of a semiconductor device. Although when the thickness of the device substrate becomes 100 μm or more, it can be handled normally, the method of manufacturing of the present invention can also be applied to a device substrate having a thickness of 100 μm or more. Additionally, a thermal resistance of a substrate is approximated by $\ln(2t/a)$ wherein "t" is the thickness of the substrate, and "a" is the size of the substrate. Generally, in the case where the size of the substrate is from a few microns to a few ten microns, since the thermal resistance saturates when the thickness of the substrate becomes about 100 μm or more, a further reduction in the thermal resistance can not be expected. Therefore, the preferred thickness of the device substrate is 20~100 μm.

From a viewpoint of reinforcing a thinned substrate, it is desirable that the thickness of a plate layer is 5 μm or more. On the other hand, when the thickness of the plate layer becomes 40 μm or more, a production cost increases and it becomes more difficult to dice the metal plate layer for separating a device, resulting in a poor productivity.

In addition, the use of a semiconductor device of the present invention enables a radio set with a high reliable performance to be manufactured.

Since the thermal resistance of the thinned semiconductor device of the present invention is greatly decreased, there is an advantage that the use of the present device makes a portable terminal unit of a radio set high efficient, high reliable and light by multiple mounting.

BRIEF DESCRIPTION OF THE INVENTION

DETAILED DESCRIPTION OF THE INVENTION

Examples of manufacturing of a semiconductor device by applying the present invention to a GaAs semiconductor device substrate having a diameter of 3 inches will be explained in detail below.

EXAMPLE 1

Figure 1:
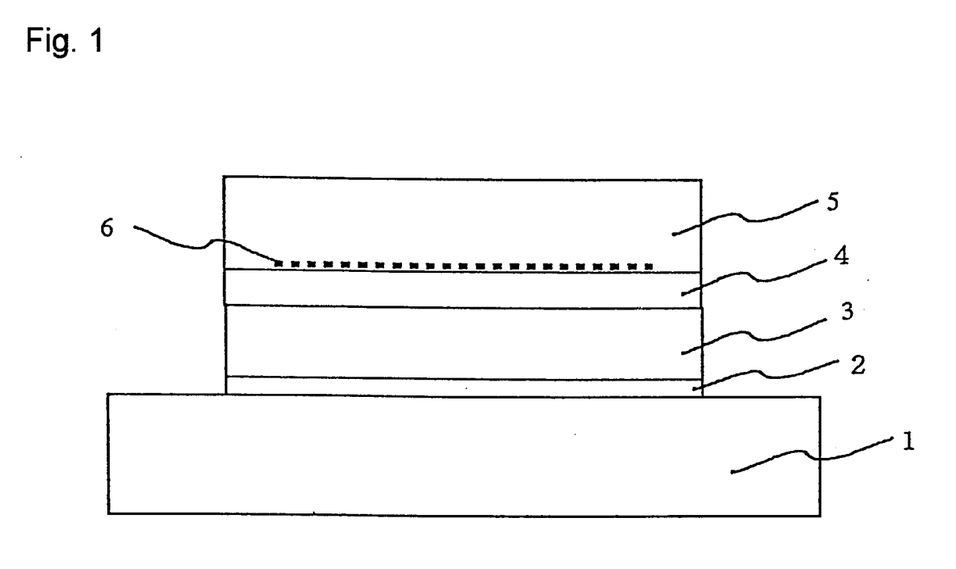
FIG. 1 shows a cross-sectional view illustrating a step of fixing a semiconductor device substrate to a glass pedestal according to the present invention.

As shown in FIG. 1, a 3-inch diameter GaAs semiconductor device substrate 5 was fixed on a dummy substrate 3 by using a heat foamable adhesive sheet 4. A heat foamable adhesive layer whose adhesive strength becomes almost zero when it foams at 120~140° C. is formed on one side of the heat foamable adhesive sheet 4 and, on the other side, a normal adhesive layer is formed. The heat foamable adhesive layer was bonded to a side of the GaAs substrate on which a device 6 had been formed and, the normal adhesive layer was bonded to a surface of a Si dummy substrate. After that, a unified semiconductor device substrate 5/heat foamable adhesive sheet 4/Si dummy substrate 3 was fixed on a glass pedestal 1 with wax 2 which melts at 60° C.

In this example, a 3-inch Si substrate having a thickness of 380 $\mu$m was used as the dummy substrate 3, satisfying a condition where an intrasubstrate fluctuation in the thickness is ±5 $\mu$m.

Figure 2:
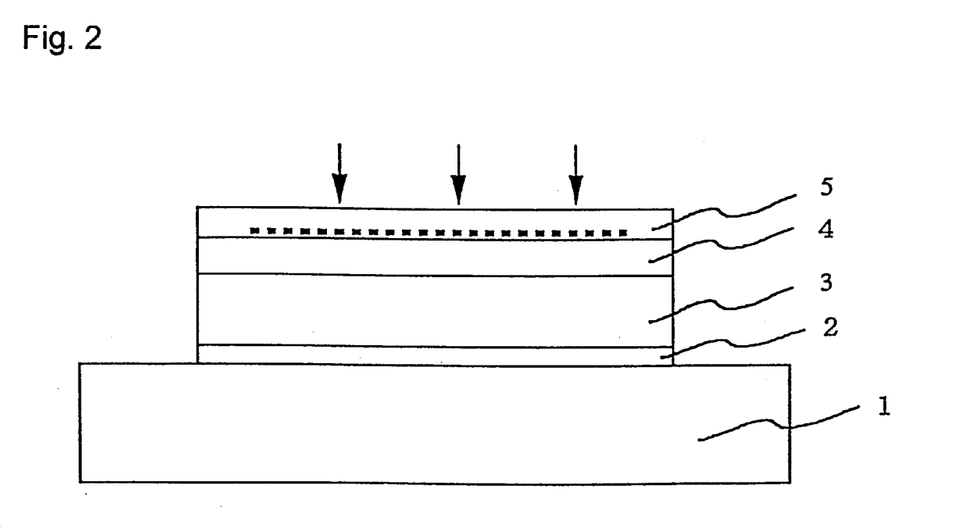
FIG. 2 shows a cross-sectional view illustrating a step of thinning a semiconductor device substrate according to the present invention.

Next, as shown in FIG. 2, the GaAs semiconductor device substrate 5 was thinned to 40 $\mu$m by grinding its back side with an abrasive having a particle size of 9 $\mu$m. As a result, the maximum difference in the thickness within the uneven surface was more than 2 $\mu$m.

In order to assure adhesion strength with a back metal layer plated on the backside of the substrate, the thinned surface was mirror-polished and, then, the surface oxide layer was thoroughly removed by etching with a phosphate etchant.

Figure 3:
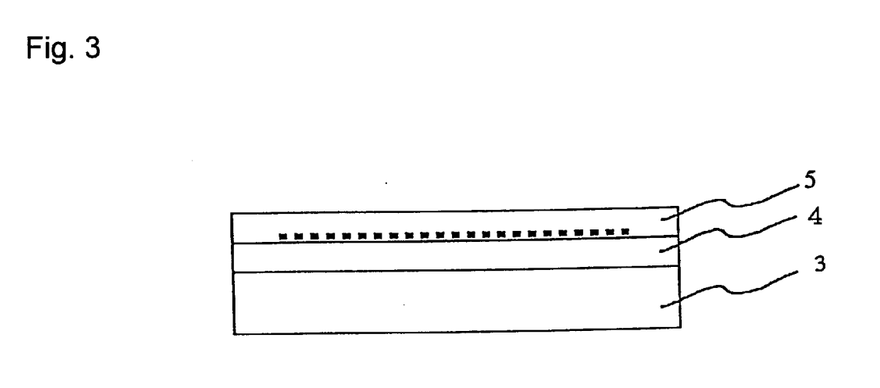
FIG. 3 shows a cross-sectional view illustrating a step of washing a semiconductor device substrate according to the present invention.

Subsequently, as shown in FIG. 3, the unified semiconductor device substrate 5/heat foamable adhesive sheet 4/Si dummy substrate 3 was separated from the glass pedestal 1 by heating to about 80° C. The thinned surface was then washed with acetone, IPA and ethanol and, subsequently, the residue of the polisher and the surface oxide layer were thoroughly removed by etching the thinned surface of the semiconductor device substrate 5 with a phosphate etchant. At this point, the etching depth was 10 $\mu$m.

Additionally, although this Example illustrates an embodiment in which a Si dummy substrate was fixed to a glass pedestal with wax to perform grinding, the present invention is not limited to this embodiment. The present invention is still effective, for example, in the case where a Si dummy substrate is fixed to a grinding stage by vacuuming to perform thinning, or the case where a Si dummy substrate is fixed, and while rotating, it is thinned by a chemical etching.

Figure 4:
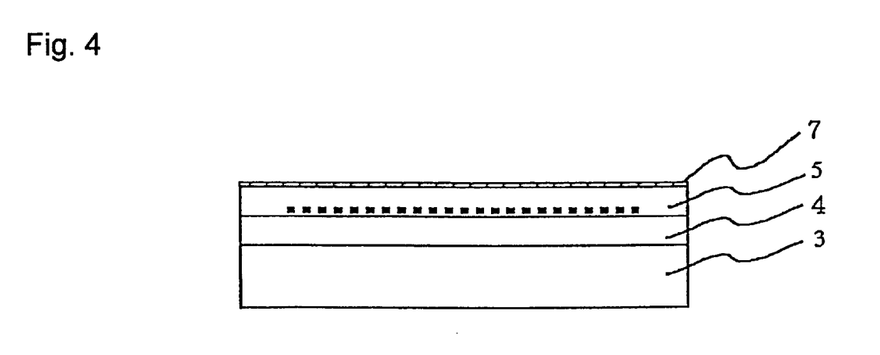
FIG. 4 shows a cross-sectional view illustrating a step of depositing a semiconductor device substrate with a power feeding metal (Ti/Au) for plating according to the present invention.
Figure 5:
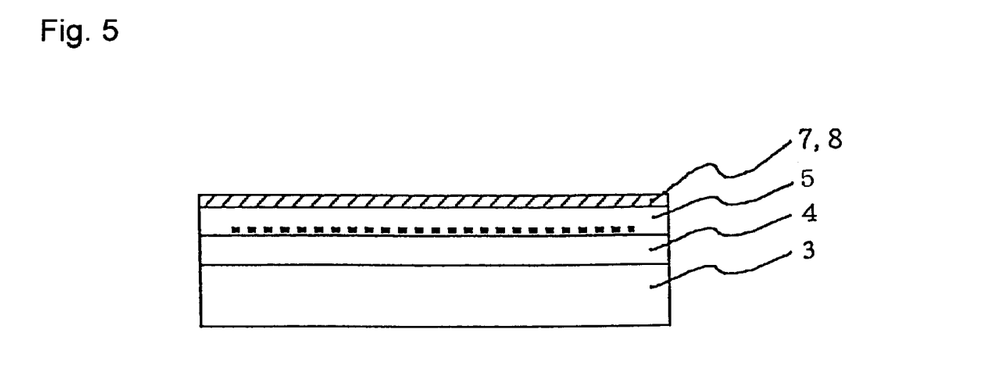
FIG. 5 shows a cross-sectional view illustrating a step of plating a thinned surface of a semiconductor device substrate with Au according to the present invention.

Subsequently, as shown in FIGS. 4 and 5, a power feeding metal layer 7 (Ti/Au; 0.05 $\mu$m/0.1 $\mu$m) was deposited on the thinned surface of the semiconductor device substrate 5 which had been washed and etched, on an electron beam deposition apparatus, and, then, an Au plate layer 8 was provided on the whole surface at a thickness of 20 $\mu$m. Since the power-feeding layer 7 was provided on the whole surface, it was easy to plate the whole surface.

During deposition of the power feeding layer 7, a temperature of the unified semiconductor device substrate 5/heat foamable adhesive sheet 4/Si dummy substrate 3 elevated to about 100° C. However, since the foaming temperature for the heat foaming adhesive sheet 4 is 120~140° C., the semiconductor substrate 5 was never peeled off from the substrate 3 during the deposition.

Subsequently, the thinned semiconductor device substrate 5 which have been provided with plate layers 7, 8 (GaAs 30 $\mu$m/Au 20 $\mu$m) was peeled off from the heat foamable adhesive sheet 4 by heating to about 120° C., washed with acetone and ethanol to remove a residue of the heat-peeling sheet on the surface of the device-forming part 6 of the GaAs substrate 5.

Only by providing the GaAs substrate having a thickness of 30 $\mu$m with a thin Au plate layer of 20 $\mu$m, an equivalent strength to that of a GaAs substrate having a thickness of 100 $\mu$m or more and, therefore, the thinned substrate never broke.

The reason why the thickness of the substrate was set to be 30 $\mu$m, and the thickness of the Au plate layer was set to be 20 $\mu$m is that in the subsequent step of dicing in which the device substrate and the metal plate layer are vertically diced at the same time, when an Au plate layer is too thick, it is difficult to dice them, resulting in deterioration in the productivity.

Figure 6:
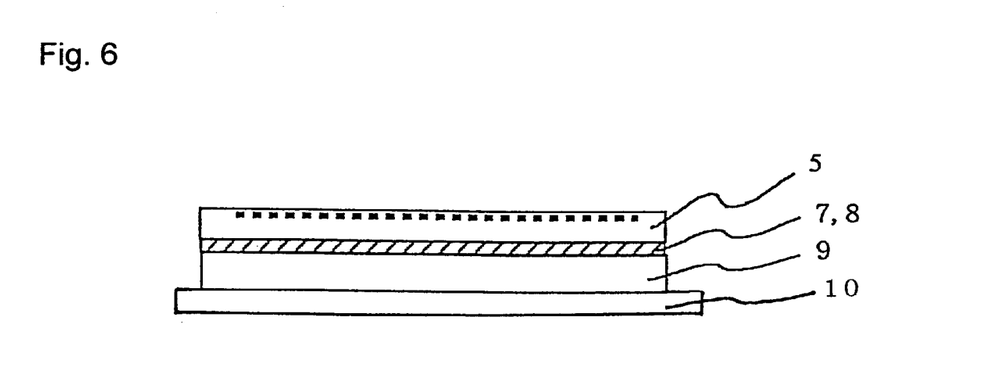
FIG. 6 shows a cross-sectional view illustrating a step of bonding a semiconductor device substrate to a dicing sheet according to the present invention.
Figure 7:
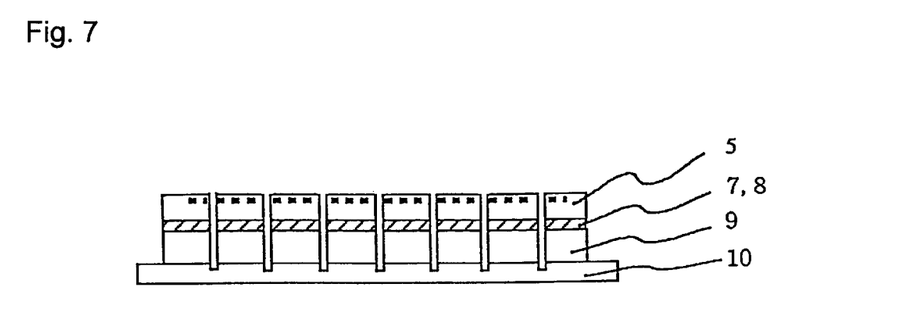
FIG. 7 shows a cross-sectional view illustrating a step of dicing a semiconductor device substrate according to the present invention.

Next, as shown in FIG. 6, in place of a high sticky dicing sheet, a heat foamable adhesive sheet 6 was first bonded to the plate layers 7, 8 of the device substrate 5 and, then, the heat foamable sheet side of the unified device substrate 5/heat foamable adhesive sheet 9 was bonded to a dicing sheet 10. Then, as shown in FIG. 7, it was diced halfway in the dicing sheet in this state.

Alternatively, when the Au plate layers 7, 8 which are back metals for the device substrate 5 are sufficiently thick, for example, when the thickness of the Au plate layers 7, 8 are 20 $\mu$m and the thickness of the device substrate 5 is 30 $\mu$m, since the strength of the device substrate 5 is equivalent to that of a device substrate having a thickness of 100 $\mu$m or more, the device substrate may be directly bonded to the dicing sheet 10 without using the heat foamable adhesive sheet 9.

Figure 8:
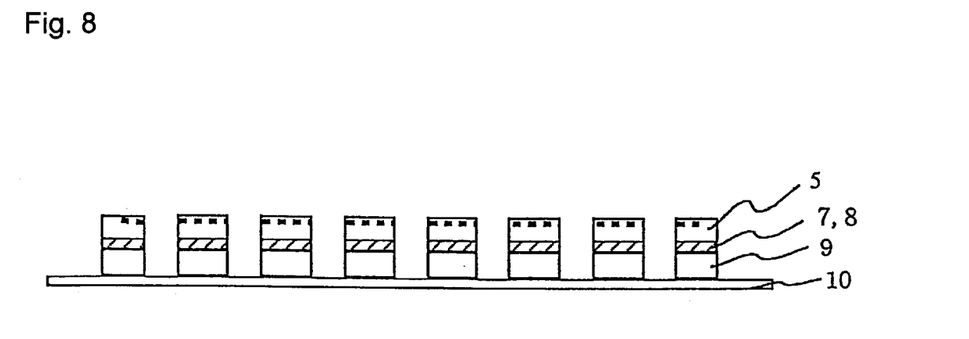
FIG. 8 shows a cross-sectional view illustrating a step of removing a diced semiconductor device from a dicing sheet according to the present invention.

After that, as shown in FIG. 8, the dicing sheet was stretched at about 60° C. to separate devices of the device substrate 5. Since the heat foamable adhesive sheet 9 and the device substrate 5 were unified, the devices can be easily peeled off from the dicing sheet without breaking the device substrate 5.

In this Example, the device substrate 5 was separated from the dicing sheet 9 by heating the whole devices on the sheet 9. Alternatively, a part of devices may be first removed from the device substrate 5, separated from the sheet 9 by heating and, then mounted.

EXAMPLE 2

By using a 3-inch GaAs HBT substrate, HBT chips comprised of a semiconductor device substrate having a thickness of 30 μm/Au 20 μm were made according to the above procedures. After dicing, peeling-off of the Au plate layer was observed with naked eyes. According to the following equation, a ratio of the number of devices in which no peeling-off is observed relative to the whole number of the observed devices, and is regarded as a yield.

$$\text{Yield (\%)} = \frac{N_t - N_f}{N_t} \times 100 \quad \text{[Equation 1]}$$

wherein, $N_t$ represents the total number of the observed devices, and $N_f$ represents the number of devices in which complete or partial peeling-off was detected.

Dependency of yield on a method of treating the backside of the GaAs substrate is shown in Table 1.

TABLE 1

| Surface treatment | method after grinding | Yield (%) |
|---|---|---|
| No mirror-polishing | Direct plating | 20 |
|  | Etching + Plating | 80 |
| Mirror-polishing | Direct plating | 0 |
|  | Etching + Plating | 100 |

When the thinned surface was directly plated without mirror-polishing after washing, the yield of the devices was only about 20% and, on the other hand, when the thinned surface was etched before plating, the yield increased to about 80%.

In the case where the thinned surface was mirror-polished, when the mirror-polished surface was directly plated, the Au plate layer thoroughly peeled off from the surface in the dicing step because the adhesion strength between the GaAs substrate and the plate layer was so weak due to a residue of a mirror-polisher and/or a surface oxide layer. However, when etching was performed after mirror treatment, since the residue of the mirror-polisher and the surface oxide layer were removed almost thoroughly, the yield became almost 100%.

Figure 9:
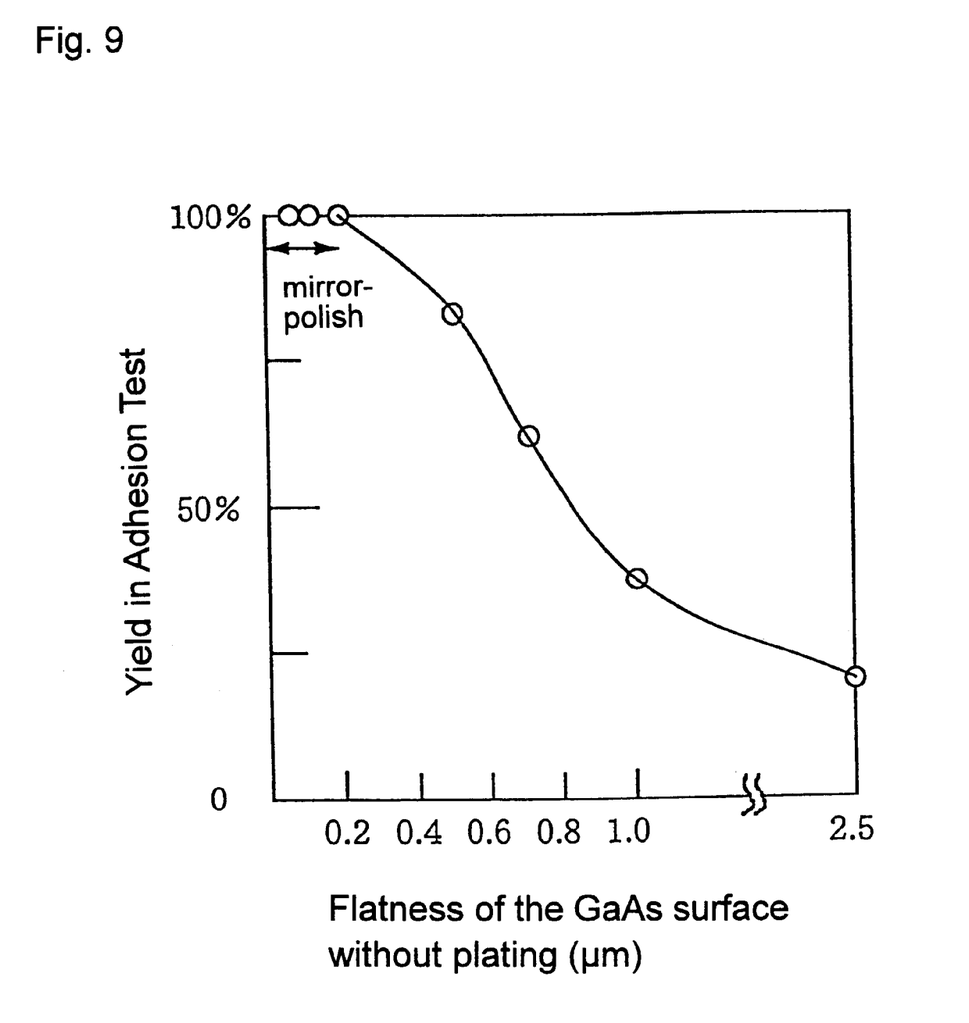
FIG. 9 shows a graphical representation indicating a relationship between the surface flatness and the yield being a ratio of no-peeling between the ground surface of the semiconductor GaAs substrate and the back metal after dicing the substrate into 0.5-mm square devices.

FIG. 9 represents the relationship between the surface flatness and the yield being a ratio of no-peeling between the ground surface of the semiconductor GaAs substrate and the back metal after dicing the substrate 5 into 0.5-mm square devices. Here, the term "surface flatness" means the maximum difference in the thickness within the uneven ground surface of the GaAs substrate as measured by using a surface roughness meter. The surface flatness was getting smaller, the yield increased. When the surface flatness was less than about 0.2 μm, the yield became almost 100%.

EXAMPLE 3

For a 300-μm GaAs HBT chip and a 30-μm GaAs/20-μm Au HBT chip, observed values of thermal resistances and the (collector-emitter) voltage at which the onset of thermal runaway occurs are listed in Table 2.

TABLE 2

|  | GaAs 300 μm | GaAs 30 μm + Au 20 μm |
|---|---|---|
| Thermal resistance $R_{th}$ (° C./W) | 34 | 17 |
| Voltage at which the onset of thermal runaway occurs (V) | 3.0 | 8.1 |

Upon thinning the substrates, the thermal resistance of the HBT chip was reduced to about 50%. In addition, the voltage at which the onset of thermal runaway occurs greatly increased from 3.0 V to 8.1 V in inverse proportion to the thermal resistance. This may be resulted from the effect of reducing the thermal resistance of the HBT chip and heat-spreading effect of the Au plate layer.

This Example explains only the case where the GaAs substrate is thinned to 30 μm, but it has been confirmed that the 3-inch GaAs substrate could been uniformly thinned to minimal 17 μm. Additionally, in that case, the thickness of the Au layer was about 20 μm. In such a case, a reduction in a thermal resistance and an increase in a voltage at which the onset of thermal runaway occurs are further expected, leading to the high performance and high reliability of HBT chips.

EXAMPLE 4

As a device used in a power amplifier of a radio communication system, Monolithic Microwave Integrated Circuit (MMIC) devices were fabricated by using a HBT of a 200-μm GaAs substrate (control) and a 30-μm GaAs/20-μm Au HBT of the present invention, and they were compared. At high frequency of 0.9~1.8 GHz and a power of 2.5 W, the mean time to failure (MTTF) of the device of the present invention became 2.5 times longer than that of the control and, therefore, the reliability of the radio communicating system was improved.

INDUSTRIAL APPLICABILITY

As discussed above, according to the present invention, by sequential steps of thinning a semiconductor device substrate and reinforcing the substrate with a back metal, a substrate with a size of 2 or 3 inches or more can be thinned uniformly to about 20 μm. That is, the present invention enables one to handle a substrate readily from a step of thinning, through a step of back-metal plating, device separation by dicing, to a step of mounting the diced devices.

In addition, since adhesion strength between a semiconductor device substrate and a back metal is reinforced by specially treating a back side of a thinned semiconductor device substrate, cracking and the like do not occur in the interface of the semiconductor device substrate and the back metal and, therefore, the thinned substrate can stand dicing. Consequently, it is possible to increase a yield of devices to 100%.

Further, the semiconductor device manufactured by the above method exerts an effect of reducing thermal resistance of the device significantly. For example, a thermal resistance of a 30-μm GaAs chip substrate with a thin Au plate layer of 20-μm thickness can be reduced to about half of that of a 300-μm GaAS substrate, for the whole device. In a high-density IC power amplifier device having a narrow spacing, since heat generated from a device part can be quickly spread to a mount package through a back metal, an effect to improve heat concentration in a device is large, leading to high performance and high reliability of devices.

Still further, a radio communication system having a high reliable performance can be realized by using a device manufactured according to the present invention.

What we claimed are:

1. A method for manufacturing a semiconductor device, which comprises:
   a step of bonding a semiconductor device substrate to a dummy substrate with a heat foamable adhesive sheet to unify them,
   a step of thinning the semiconductor device substrate while it is unified with the dummy substrate, and
   a step of dicing the semiconductor substrate after removing it from the dummy substrate, wherein the semiconductor device substrate is fixed to the dummy substrate by bonding a heat foamable-adhesive side of the heat foamable adhesive sheet directly to a device side of the semiconductor device substrate, and by bonding a normal adhesive side of the heat foamable adhesive sheet to the dummy substrate.

2. The method for manufacturing a semiconductor device according to claim 1, which further comprises a step of fixing the semiconductor device substrate unified with the dummy substrate to a pedestal support prior to the step of thinning.

3. The method for manufacturing a semiconductor device according to claim 1, which further comprises a step of back-metal plating the semiconductor device substrate while it is unified with the dummy substrate.

4. The method for manufacturing a semiconductor device according to claim 3, wherein a temperature for heat-foaming the heat foamable adhesive sheet is higher than a temperature of the substrate during the step of back-metal plating.

5. The method for manufacturing a semiconductor device according to claim 3, wherein an uneven surface of the substrate which has been thinned in the step of thinning is mirror-polished prior to the step of back-metal plating so that a maximum difference of a thickness within the uneven surface is 0.2 $\mu$m or less.

6. The method for manufacturing a semiconductor device according to claim 5, wherein the mirror-polished surface is treated by etching.

7. The method for manufacturing a semiconductor device according to claim 3, wherein the step of back-metal plating the semiconductor device substrate comprises attaching a power feeding metal and, then, plating a metal.

8. The method for manufacturing a semiconductor device according to claim 3, wherein the step of dicing the semiconductor device substrate comprises bonding the semiconductor device substrate to a foaming surface of the heat foamable adhesive sheet, bonding a dicing sheet to an opposite surface of the heat foamable adhesive sheet and, then, dicing them halfway in the dicing sheet.

9. The method for manufacturing a semiconductor device according to claim 8, wherein the diced semiconductor device substrate is peeled off from the dicing sheet while it is unified with the heat foamable adhesive sheet and, then, the semiconductor device substrate is separated from the heat foamable adhesive sheet by heating.

10. The method for manufacturing a semiconductor device according to claim 1, wherein the semiconductor device substrate is a compound semiconductor substrate.

11. The method for manufacturing a semiconductor device according to claim 1, wherein the dummy substrate is a substrate selected from a group consisting of a silicone wafer, a glass plate, a ceramic plate and a metal plate.

* * * * *